United States Patent [19]
Melisaris et al.

[11] Patent Number: 6,136,497
[45] Date of Patent: Oct. 24, 2000

[54] LIQUID, RADIATION-CURABLE COMPOSITION, ESPECIALLY FOR PRODUCING FLEXIBLE CURED ARTICLES BY STEREOLITHOGRAPHY

[75] Inventors: Anastasios P. Melisaris, Stevenson Ranch; Wang Renyi, Alhabra; Thomas H Pang, Castaic, all of Calif.

[73] Assignee: Vantico, Inc., Brewster, N.Y.

[21] Appl. No.: 09/050,279

[22] Filed: Mar. 30, 1998

[51] Int. Cl.[7] .............................. G03F 7/027; G03F 7/038; G03C 9/08
[52] U.S. Cl. ..................... 430/269; 430/280.1; 264/401
[58] Field of Search .............. 430/269; 264/401

[56] References Cited

U.S. PATENT DOCUMENTS

| | | | |
|---|---|---|---|
| 5,434,196 | 7/1995 | Ohkawa et al. | 522/100 |
| 5,476,748 | 12/1995 | Steinmann et al. | 430/269 |
| 5,494,618 | 2/1996 | Sitzmann et al. | 264/401 |
| 5,506,087 | 4/1996 | Lapin et al. | 430/269 X |
| 5,510,226 | 4/1996 | Lapin et al. | 430/269 |
| 5,605,941 | 2/1997 | Steinmann et al. | 522/170 |
| 5,705,116 | 1/1998 | Sitzmann et al. | 264/401 |

FOREIGN PATENT DOCUMENTS

| | | |
|---|---|---|
| 0562826 | 3/1993 | European Pat. Off. |
| 0579503 | 7/1993 | European Pat. Off. |
| 0 822 445 A1 | 7/1997 | European Pat. Off. |
| 4138309 | 5/1993 | Germany. |
| 760843 | 7/1995 | Japan. |
| 9194540 | 9/1997 | Japan. |
| 9217004 | 9/1997 | Japan. |
| 97/38354 | 10/1997 | WIPO. |

OTHER PUBLICATIONS

Derwent Abst. 93–305188 [39].
Derwent Abst. 93–176448 [22].
Derwent Abst. 94–017991 [03].
Derwent Abst. 95–136469.
Derwent Abst. 97–431498.
Derwent Abst. 97–466285.
Patent Abstracts of Japan, Publication No. 09194540A.
Results of Search—abstracts (Search criteria not given—Data base and files not given).
Steinmann et al, 128: 174150, CA Files, STN Database Service, Chemical Abstracts, American Chemical Society, 1999, Abstract of EP 0822,445–A1, dated Jul. 21, 1997.
Steinmann et al, 1998—103049, West 1.1a Database, File Derwent, English Abstract of EP 0822 445–A1, dated Jul. 21, 1997.

*Primary Examiner*—Cynthia Hamilton
*Attorney, Agent, or Firm*—David R. Crichton; Michele A. Kovaleski

[57] ABSTRACT

The present invention relates to stereolithographic compositions containing an actinic radiation-curable and cationically polymerizable organic substance, a cationic initiator, a radical photoinitiator, and at least one cationic reactive modifier containing at least two reactive groups per molecule or at least one polyether polyol or mixtures thereof. The cationic reactive modifier has at least one chain extension segment with a molecular weight of at least about 100 and not more than about 2,000. The polyether polyol has a molecular weight greater than or equal to about 4,000. The use of the cationically reactive modifiers and polyether polyol modifiers substantially increases the flexibility and toughness of the cured articles without compromising photospeed, accuracy and wetting-recoatability of the compositions. The present invention further relates to a method of producing a cured product, particularly three-dimensional shaped articles by treating the composition described above with actinic radiation.

19 Claims, No Drawings

LIQUID, RADIATION-CURABLE COMPOSITION, ESPECIALLY FOR PRODUCING FLEXIBLE CURED ARTICLES BY STEREOLITHOGRAPHY

The present invention relates to a liquid, radiation-curable composition which is particularly suitable for the production of three-dimensional shaped articles by means of stereolithography, to a process for the production of a cured product and, in particular, for the stereolithographic production of a three-dimensional shaped article from this composition.

BACKGROUND

The production of three-dimensional articles of complex shape by means of stereolithography has been known for a relatively long time. In this technique the desired shaped article is built up from a liquid, radiation-curable composition with the aid of a recurring, alternating sequence of two steps (a) and (b); in step (a), a layer of the liquid, radiation-curable composition, one boundary of which is the surface of the composition is cured with the aid of appropriate radiation, generally radiation produced by a preferably computer-controlled laser source, within a surface region which corresponds to the desired cross-sectional area of the shaped article to be formed, at the height of this layer, and in step (b) the cured layer is covered with a new layer of the liquid, radiation-curable composition, and the sequence of steps (a) and (b) is repeated until a so-called green model of the desired shape is finished. This green model is, in general, not yet fully cured and must therefore, normally, be subjected to post-curing.

The mechanical strength of the green model (modulus of elasticity, fracture strength), also referred to as green strength, constitutes an important property of the green model and is determined essentially by the nature of the stereolithographic-resin composition employed. Other important properties of a stereolithographic-resin composition include a high sensitivity for the radiation employed in the course of curing and a minimum curl factor, permitting high shape definition of the green model. In addition, for example, the precured material layers should be readily wettable by the liquid stereolithographic-resin composition, and of course not only the green model but also the ultimately cured shaped article should have optimum mechanical properties. A still further important property of the cured article is increased flexibility and toughness, as measured by elongation at break and Izod impact resistance.

Liquid, radiation-curable compositions for stereolithography which meet at least some of the abovementioned requirements are described, for example, in U.S. Pat. No. 5,476,748, which is incorporated herein by reference. The so-called hybrid systems compositions shown therein comprise free-radically and cationically photopolymerizable components. Such hybrid compositions comprise at least:
(A) a liquid difunctional or more highly functional epoxy resin or a liquid mixture consisting of difunctional or more highly functional epoxy resins;
(B) a cationic photoinitiator or a mixture of cationic photoinitiators;
(C) a free-radical photoinitiator or a mixture of free-radical photoinitiators; and
(D) at least one liquid poly(meth)acrylate having a (meth)acrylate functionality of more than 2,
(E) at least one liquid diacrylate, and
(F) a polyol component selected from the group consisting of OH-terminated polyethers, polyesters and polyurethanes.

Such hybrid systems can optionally further contain vinyl ether-based resins or other cationically cured components such as oxetanes, spiro-ortho esters.

It is known to a person skilled in the art that the majority of commercial hybrid stereolithography compositions suffer from very low elongation at break and Izod impact resistance. Their average values are around 4% and 0.45 ft.lb/in, respectively. Cured objects resulting from these compositions are very brittle, and not very functional for rapid prototyping and verification type applications.

Attempts have been made to solve the problem of brittleness of cured articles produced from stereolithography compositions, in general. To date, the efforts have concentrated on acrylate-based compositions, which use acrylate urethane oligomers or their relatively low molecular weight polymers as flexibilizers. It is well known that urethane acrylate oligomers or polymers are highly flexible and tough (high Izod impact resistant) materials. Incorporation of these molecules into acrylate compositions, accordingly, makes the cured objects flexible and tough (durable). These efforts employ specific diluents, such as urethane acrylates, as shown in European patent application 562,826 to Loctite Corp., monomeric or oligomeric aliphatic urethanes, as shown in German patent application DE 4,138,309, to EOS GmbH (Electro Optical Systems), monofunctional diluting monomers, as shown in Japanese patent application 97-431498, to Mitsubishi Rayon Co., Ltd., and an unsaturated urethane, as shown in Japanese patent application 97-466285, to Takemoto Oil & Fat Co., Ltd. Cured objects resulting from such compositions are flexible and show relatively high impact resistance, sometimes close to 1–1.3 ft.lb/in.

A major disadvantage of flexibilized acrylate urethane compositions is the fact that: 1) polymerization is hindered by atmospheric oxygen because the polymerization thereof is of radical nature; 2) the cure shrinkage is unacceptably large; and 3) the acrylate urethane compounds are irritant to the skin, particularly when the viscosity is low (low viscosity is highly preferred for stereolithography applications). Attempts to incorporate acrylate urethane flexibilizers into hybrid stereolithographic compositions have been unsuccessful as a means for improving flexibility and toughness. This approach tends to reduce photospeed to unacceptable levels. This reduction in photospeed is due to the fact that the acid generated from the disassociation of the cationic photoinitiator, which is responsible for the polymerization of the epoxy ring or any other cationically cured compound, reacts with the nitrogen of the urethane group, thus prohibiting the cationic photopolymerization reaction from taking place.

On the other hand, while cationic or hybrid cationic-radical stereolithographic compositions can moderate the effects of the aforementioned problems of the acrylate chemistry, the cured objects are very brittle and show very low toughness.

An alternative technique that has been used for improving the flexibility of hybrid stereolithography compositions entails the use of low to medium range molecular weight diols triols or polyols, especially polyether polyols. This approach has been employed for years, and is still being used. It relies on the reduction of the crosslink density of the three dimensional network as a means of reducing the brittleness of a cured object. As an example, a recent worldwide patent application on photo-curable stereolithographic resin compositions to DSM Corp, Japan Synthetic Rubber Co., and Japan Fine Coatings, Co., Ltd., WO 97/38354 (Oct. 16, 1997) teaches the use of polyether polyols to increase the extensibility and toughness of the three-dimensional object. These polyether polyols have on average about 3 or more hydroxyl groups in one molecule. Examples of the suggested polyether polyols include original or ethyleneoxide chain-extended glycerol, pentaerythiritol, trimethylolpropane, sorbitol, sucrose.

The preferable molecular weight of the polyether polyol is about 100 to 2000, and more preferably about 160–1000. This patent also teaches that "if polyether polyols having too large molecular weight are used, it results in lowering the mechanical strength of the three-dimensional object obtained by the photo-fabrication process".

However, major drawbacks of the polyether polyol flexibilizing method are 1) drastic reduction of thermal properties such as heat deflection temperature, glass transition temperature, 2) reduction of the rigidity of the cured article and 3) reduction of water and humidity resistance of the cured object. Despite all previous attempts, there exists a need for a stereolithography composition capable of producing a flexible and durable cured article for which the photospeed, and cure depths are commercially acceptable.

SUMMARY OF THE INVENTION

A first apect of the present invention relates to a process for the production of three-dimensional articles by stereolithography using a radiation-curable composition. The composition is a mixture of at least one one cationically polymerizable compound and/or at least one radically polymerizable compound, at least one photoinitiator for cationic and/or radical polymerizations and at least one reactive cationic modifier (RCM) containing at least two reactive groups and or a polyether polyol (PEPO), wherein the RCM has at least one chain extension segment with a molecular weight of at least 100 and not more than 2,000, and PEPO has a molecular weight greater than or equal to 4,000. The solid or liquid cationically polymerizable compound in the radiation-curable composition can be at least a glycidylether of an aliphatic or alicyclic or aromatic alcohol or polybasic acid, cycloaliphatic epoxide, cresol epoxy novolac, phenol epoxy novolac, vinylether, lactone, spiro-orthoester, oxetane, acetal, cyclic sulfide, cyclic ether or siloxane derivative.

More particularly, the present invention relates to a liquid, radiation-curable stereolithographic composition containing from 20 to 90 percent by weight of actinic radiation-curable and cationically polymerizable organic substances, from 0.05 to 12 percent by weight of a cationic initiator, from 0.5 to 60 percent by weight of at least one reactive cationic modifier containing at least two reactive groups per molecule, or at least ore polyether polyol or mixtures thereof. The RCM has at least one chain extension segment with a molecular weight of at least about 100 and not more than about 2,000. The PEPO has a molecular weight greater than or equal to about 4,000. The composition further optionally contains up to 10 percent by weight of a radical photoinitiator, up to 40 percent by weight of a free radically curable component containing at least one mono- or poly (methacrylate), and up to 10 percent by weight of customary additives.

The actinic radiation-curable and cationically polymerizable organic substance preferably contains 20 to 80% by weight of at least one solid or liquid cycloaliphatic polyepoxide having at least two epoxy groups with epoxy equivalent weight between 70 and 350 g/eq, or mixtures thereof. Alternatively, the actinic radiation-curable and cationically polymerizable organic substance preferably 3 to 70% by weight of at least one solid or liquid polyglycidylether of aliphatic, alicyclic or aromatic alcohol or polybasic acid, epoxy cresol novolac, epoxyphenol novolac, spiro-orthoester compounds, oxetane compounds, having at least two cationically reactive groups per molecule, or mixtures thereof.

In a further aspect, the actinic radiation-curable and cationically polymerizable organic substance contains 2 to 40% by weight of at least one solid or liquid vinylether having at least two vinylether groups, or at least one hydroxyl- or epoxy-functionalized vinylether compound.

The cationically curable component can be a mixture of at least one polyglycidyl compound or cycloaliphatic polyepoxide or aromatic ring-, epoxy cresol novolac or epoxy phenol novolac-containing polyglycidyl compound having, on average, at least two epoxy groups per molecule and at least one vinyl ether-based resin.

The curable composition optionally contains about 3 to 40% by weight of a free radically curable component containing at least one mono- or poly(meth)acrylate. The polyfunctional (meth)acrylate preferably has, on average, between 2 to 7 acrylate groups.

The cationic reactive modifier and the polyether polyol modifier are preferably solid or liquid at room temperature. Alternatively, the cationic reactive modifier comprises at least one reactive solid or liquid compound containing an aliphatic or aromatic epoxide having glycidyl group(s) or cycloaliphatic epoxy group or vinylether group or spiro-orthoester group or oxetane group. In a further aspect, the RCM comprises a component having at least one cationic reactive group and at least one hydroxyl group. More preferably, the reactive modifier has an equivalent weight per epoxide at least about 180 and not more than about 2000 or each chain extension segment of the reactive modifier contains independently from one another at least 4 and not more than about 80 repeating units of $C_2$–$C_4$alkoxy, oxytetramethylene-, ethyl-, propyl-, isoprdpyl-, saturated or unsaturated $C_2$–$C_4$ carbon atoms, or mixtures thereof.

The reactive modifier is preferably at least one reactive liquid or solid glycidyl compound having, on average, at least two epoxy groups per molecule of aliphatic or alicyclic or aromatic alcohols or polybasic acids containing a plurality of chain extension segments per molecule, wherein each chain extension segment has a molecular weight of at least about 100 and not more than 2000. More preferably, the cationic reactive modifier is a polyglycidyl ether of an aliphatic polyhydric alcohol or adducts or polybasic acid thereof chain extended with ethoxy-, propoxy-, isopropoxy-, oxytetramethylene-, saturated or unsaturated alkyl-, alicyclic-, polyether- and polyester- linkages, or combinations thereof. Most preferably, the reactive modifier is a triglycidylether of poly(isopropoxylated) glycerol having the following formula:

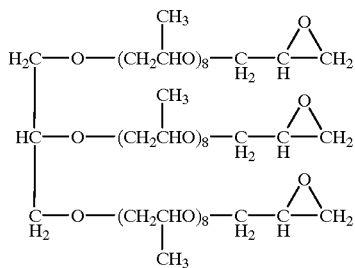

Alternatively, the cationic reactive modifier is a dimer acid diglycidylether ester or polyglycol polyepoxide or polyglycidylether of castor oil having at least two epoxy groups per molecule. The curable composition preferably contains from about 0.5 to about 60 percent by weight of cationic reactive modifier.

In an alternative aspect of the invention, the polyether-polyol has the following formula:

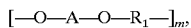

where m is such that the molecular weight of the polyether polyol is greater than or equal to 4,000, A is para-, meta- or ortho- substituted aromatic diol residue selected from Bisphenol A, Bisphenol F, p, m, o-Biphenyl, p-, m-,o-Hydroquinone, substituted with aliphatic or aromatic substituents having (un)saturated $C_1$–$C_5$alkylgroups, ether- or ester-groups; para, meta and ortho substituted aromatic structures of the following structure:

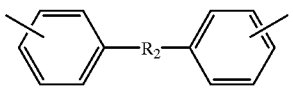

where $R_2$ is at least one —O—, —$SO_2$—, —CO—, —COO—, —$OCH_2$—, —$CH_2$—, $(CH_3)_2C<$, and an aliphatic or aromatic chain extension segment having 1 to 100 repeating $C_1$–$C_4$ units of saturated and/or unsaturated alkyl-, alkoxy-, aryloxy-, ethoxy, propoxy, isopropoxy, oxytetramethylene, aliphatic or aromatic ester, siloxane and carbonate linkages. $R_1$ has the structure $CH_2CH(OH)$ $(CR_3R_4)_n$—, where n is greater than or equal to 1, $R_3$ and $R_4$ are independently of one another —H, —$CH_3$, —$CH_2CH_3$, saturated or unsaturated linear or branched $C_1$–$C_{20}$alkylgroups, aliphatic or alicyclic or aromatic segment containing aromatic ether, aliphatic ether, ethoxy, propoxy, isopropoxy, oxytetramethylene, aliphatic or aromatic ester, siloxane and carbonate linkages.

A can be a linear or branched aliphatic or substituted alicyclic diol or unsubstituted alicyclic diol residue bearing saturated or unsaturated $C_1$–$C_{20}$alkylgroups, ether, ethoxy, propoxy, isopropoxy, oxytetramethylene, ester, sulfone, sulfoxide, siloxane and carbonate linkages. A, in the alternative, can be an aliphatic or substituted alicyclic diol or unsubstituted alicyclic diol, cyclohexane dimethanol, hydrogenated Bisphenol A and hydrogenated Bisphenol F. Preferably, A is an aromatic diol residue selected from Bisphenol A, Bisphenol F, hydroquinone, biphenol, aromatic diols bearing a flexible segment between the aromatic rings and $R_1$ is —$CH_2CH(OH)CH_2$—. More preferably, A is an aromatic diol residue selected from Bisphenol A, $R_1$ is —$CH_2CH(OH)CH_2$— and m is greater than 15.

The composition preferably contains the reactive polyether polyol modifier from about 0.5 to about 45 percent by weight.

The reactive modifier solid or liquid polyether-polyol component can be blended, dispersed, diluted or dissolved in at least one liquid or solid diol or polyol containing aromatic rings or polyester linkages or polyether linkages or which is a derivative of aliphatic, alicyclic or aromatic polyhydric alcohols.

The curable composition can further contain from 0.5 to 40 percent by weight of a liquid or solid polyhydroxyl compound. The polyhydroxyl compound can contain aliphatic, alicyclic or substituted alicyclic groups. The polyhydroxyl compound can alternatively have aromatic carbon rings in its molecule.

The present invention further relates to a method of producing a cured product, in which the composition described above is treated with actinic radiation. More preferably, the present invention relates to a method for producing three-dimensional shaped articles by treating a radiation-curable composition described above with actinic radiation to form an at least partially cured layer on the surface of said composition within a surface region corresponding to a desired cross-sectional area of the three-dimensional article to be formed. The at least partially cured layer produced in step (a) is then covered with a new layer of the radiation-curable composition. Steps (a) and (b) are repeated until an article having the desired shape is formed. Optionally, the resulting article is subjected to post-curing.

These and other aspects of the invention can be practiced alone or in combination. Other aspects of the invention will be apparent to those of skill in the art upon the review of the teachings herein.

DETAILED DESCRIPTION OF THE INVENTION

The novel compositions herein contain, in the broadest sense, a mixture of at least one cationically curable compound, at least one photoinitator for the cationically cured compound(s), and a cationic reactive modifier or polyether-polyol modifier. The compositions further optionally contain at least one free radically curable compound, a free radical photoinitiator/sensitizer and a hydroxyl-group containing compound.

The cationically curable liquid or solid compound may expeditiously be a polyglycidyl compound or cycloaliphatic polyepoxide or epoxy cresol novolac or epoxy phenol novolac compound and which on average possesses more than one epoxide group (oxirane ring) in the molecule. Such resins may have an aliphatic, aromatic, cycloaliphatic, araliphatic or heterocyclic structure; they contain epoxide groups as side groups, or these groups form part of an alicyclic or heterocyclic ring system. Epoxy resins of these types are known in general terms and are commercially available.

Polyglycidyl esters and poly(β-methylglycidyl) esters are one example of suitable epoxy resins. Said polyglycidyl esters can be obtained by reacting a compound having at least two carboxyl groups in the molecule with epichlorohydrin or glycerol dichlorohydrin or β-methylepichlorohydrin. The reaction is expediently carried out in the presence of bases. The compounds having at least two carboxyl groups in the molecule can in this case be, for example, aliphatic polycarboxylic acids, such as glutaric acid, adipic acid, pimelic acid, suberic acid, azelaic acid, sebacic acid or dimerized or trimerized linoleic acid. Likewise, however, it is also possible to employ cycloaliphatic polycarboxylic acids, for example tetrahydrophthalic acid, 4-methyltetrahydrophthalic acid, hexahydrophthalic acid or 4-methylhexahydrophthalic acid. It is also possible to use aromatic polycarboxylic acids such as, for example, phthalic acid, isophthalic acid, trimellitic acid or pyromellitic acid, or else carboxyl-terminated adducts, for example of trimellitic acid and polyols, for example glycerol or 2,2-bis(4-hydroxycyclohexyl)propane, can be used.

Polyglycidyl ethers or poly(β-methylglycidyl) ethers can likewise be used. Said polyglycidyl ethers can be obtained by reacting a compound having at least two free alcoholic hydroxyl groups and/or phenolic hydroxyl groups with a suitably substituted epichlorohydrin under alkaline conditions or in the presence of an acidic catalyst followed by alkali treatment. Ethers of this type are derived, for example, from acyclic alcohols, such as ethylene glycol, diethylene glycol and higher poly(oxyethylene) glycols, propane-1,2-diol, or poly(oxypropylene) glycols, propane-1,3-diol, butane-1,4-diol, poly(oxytetramethylene) glycols, pentane-1,5-diol, hexane-1,6-diol, hexane-2,4,6-triol, glycerol, 1,1,1-trimethylolpropane, bistrimethylolpropane, pentaerythritol, sorbitol, and from polyepichlorohydrins. Suitable glycidyl ethers can also be obtained, however, from cycloaliphatic alcohols, such as 1,3- or 1,4-dihydroxycyclohexane, bis(4-hydroxycyclo-hexyl)methane, 2,2-bis(4-hydroxycyclohexyl)propane or 1,1-bis (hydroxymethyl)cyclohex-3-ene, or they possess aromatic rings, such as N,N-bis(2-hydroxyethyl)aniline or p,p'-bis(2-hydroxyethylamino) diphenylmethane.

Particularly important representatives of polyglycidyl ethers or poly(P-methylglycidyl) ethers are based on phenols; either on monocylic phenols, for example on resorcinol or hydroquinone, or on polycyclic phenols, for example on bis(4-hydroxyphenyl)methane (bisphenol F), 2,2-bis(4-hydroxyphenyl)propane (bisphenol A), or on condensation products, obtained under acidic conditions, of phenols or cresols with formaldehyde, such as phenol novolaks and cresol novolaks. These compounds are particularly preferred as epoxy resins for the present invention, especially diglycidyl ethers based on bisphenol A and bisphenol F and mixtures thereof.

Poly(N-glycidyl) compounds are likewise suitable for the purposes of the present invention and are obtainable, for example, by dehydrochlorination of the reaction products of epichlorohydrin with amines containing at least two amine hydrogen atoms. These amines may, for example, be n-butylamine, aniline, toluidine, m-xylylenediamine, bis (4aminophenyl)methane or bis(4-methylaminophenyl) methane. However, other examples of poly(N-glycidyl) compounds include N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

Poly(S-glycidyl) compounds are also suitable as the cationic curing resin herein, examples being di-S-glycidyl derivatives derived from dithiols, for example ethane-1,2-dithiol or bis(4-mercaptomethylphenyl) ether.

Examples of epoxide compounds in which the epoxide groups form part of an alicyclic or heterocyclic ring system include bis(2,3-epoxycyclopentyl) ether, 2,3-epoxycyclopentyl glycidyl ether, 1,2-bis(2,3-epoxycyclopentyloxy)ethane, bis(4-hydroxycyclohexyl) methane diglycidyl ether, 2,2-bis(4-hydroxycyclohexyl) propane diglycidyl ether, 3,4-epoxycyclohexyl-methyl 3,4-epoxycyclohexanecarboxylate, 3,4-epoxy-6-methyl-cyclohexylmethyl 3,4-epoxy-6-methylcyclohexanecarboxylate, di(3,4-epoxycyclohexylmethyl) hexanedioate, di(3,4epoxy-6-methylcyclohexylmethyl) hexanedioate, ethylenebis(3,4-epoxycyclohexane-carboxylate, ethanediol di(3,4-epoxycyclohexylmethyl) ether, vinylcyclohexene dioxide, dicyclopentadiene diepoxide or 2-(3,4-epoxycyclohexyl-5,5-spiro-3,4-epoxy)cyclohexane-1,3-dioxane.

However, it is also possible to employ epoxy resins in which the 1,2-epoxide groups are attached to different heteroatoms or functional groups. Examples of these compounds include the N,N,O-triglycidyl derivative of 4-aminophenol, the glycidyl ether/glycidyl ester of salicylic acid, N-glycidyl-N'-(2-glycidyloxypropyl)-5,5-dimethylhydantoin or 2-glycidyloxy-1,3-bis(5,5-dimethyl-1-glycidylhydantoin-3-yl)propane.

Also conceivable is the use of liquid prereacted adducts of epoxy resins, such as those mentioned above, with hardeners for epoxy resins.

It is of course also possible to use liquid mixtures of epoxy resins in the novel compositions.

Examples of cationically polymerizable organic substances other than epoxy resin compounds include oxetane compounds, such as trimethylene oxide, 3,3-dimethyloxetane and 3,3-dichloromethyloxethane, 3-ethyl-3-phenoxymethyloxetane, and bis(3-ethyl-3-methyloxy) butane; oxolane compounds, such as tetrahydrofuran and 2,3-dimethyl-tetrahydrofuran; cyclic acetal compounds, such as trioxane, 1,3-dioxalane and 1,3,6-trioxan cycloctane; cyclic lactone compounds, such as beta-propiolactone and epsilon-caprolactone; thiirane compounds, such as ethylene sulfide, 1,2-propylene sulfide and thioepichlorohydrin; thiotane compounds, such as 1,3-propylene sulfide and 3,3-dimethylthiothane.

Vinyl ethers that can be used in stereolithography compositions include ethyl vinylether, n-propyl vinylether, isopropyl vinylether, n-butyl vinylether, isobutyl vinylether, octadecyl vinylether, cyclohexyl vinylether, butanediol divinylether, cyclohexanedimethanol divinylether, diethyleneglycol divinylether, triethyleneglycol divinylether, tert-butyl vinylether, tert-amyl vinylether, ethylhexyl vinylether, dodecyl vinylether, ethyleneglycol divinylether, ethyleneglycolbutyl vinylether, hexanediol divinylether, diethyleneglycol monovinylether, triethyleneglycol methylvinylether, tetraethyleneglycol divinylether, trimethylolpropane trivinylether, aminopropyl vinylether, diethylaminoethyl vinylether, ethylene glycol divinyl ether, polyalkylene glycol divinyl ether, alkyl vinyl ether and 3,4-dihydropyran-2-methyl 3,4-dihydropyran-2-carboxylate. Commercial chain extended vinyl ethers include the Pluriol-E200 divinyl ether (PEG200-DVE), poly-THF290 divinylether (PTHF290-DVE) and polyethyleneglycol-520 methyl vinylether (MPEG500-VE) all of BASF Corp. Hydroxyl-functionalized vinylethers include butanediol monovinylethers, cyclohexanedimethanol monovinylether, ethyleneglycol monovinylether, hexanediol monovinylether, polyethyleneglycol monovinylethers.

Another highly important class of vinyl ethers that are suitable for stereolithography and may be used in the hybrid flexible stereolithography compositions are all those included in the U.S. Pat. No. 5,506,087, which is incorporated herein by reference. More preferred are vinyl ethers commercially available from AlliedSignal under the tradenames Vectomer 4010, Vectomer 5015, Vectomer 4020.

Other cationically cured compounds include spiro ortho esters that are prepared by reacting epoxy compounds with lactone; ethylenically unsaturated compounds, such as vinylcyclohexane, n-vinyl-2-pyrrolidone and its various derivatives, isobutylene and polybutadiene, and derivatives of the above compounds.

The above cationically polymerizable compounds may be used alone or as a mixture of two or more thereof depending upon the desired performance.

Additional cationically curable commercial products that can be used herein include: Uvacure 1500, Uvacure 1501, Uvacure 1502, Uvacure 1530, Uvacure 1531, Uvacure 1532, Uvacure 1533, Uvacure 1534, Uvacure 1561, Uvacure 1562, all commercial products of UCB Radcure Corp., Smyrna, Ga.; UVR-6105, UVR-6100, UVR-6110, UVR-6128, UVR-6200, UVR-6216 (Union Carbide Corp.), the Araldite GY series that is Bisphenol A epoxy liquid resins, the Araldite CT and GT series that is Bisphenol A epoxy solid resins, the Araldite GY and PY series that is Bisphenol F epoxy liquids, the cycloaliphatic epoxides Araldite CY 179 and PY 284, the Araldite DY and RD reactive diluents series, the Araldite ECN series of epoxy cresol novolacs, the Araldite EPN series of epoxy phenol novolacs, all commercial products of Ciba Specialty Chemicals Corp., the Heloxy and Epon series of Shell Corp., the DER series of flexible aliphatic and Bisphenol A liquid or solid epoxy resins the DEN series of epoxy novolac resins, all commercial products of Dow Corp., Celoxide 2021, Celoxide 2021 P, Celoxide 2081, Celoxide 2083, Celoxide 2085, Celoxide 2000, Celoxide 3000, Glycidole, AOEX-24, Cyclomer A200, Cyclomer M-100, Epolead GT-300, Epolead GT-302, Epolead GT-400, Epolead 401, Epolead 403, (Daicel Chemical Industries Co., Ltd.), Epicoat 828, Epicoat 812, Epicoat 872, Epicoat CT 508, (Yuka Shell Co., Ltd.), KRM-2100, KRM-2110, KRM-2199, KRM-2400, KRM-2410, KRM-2408, KRM-2490, KRM-2200, KRM-2720, KRM-2750 (Asahi Denka Kogyo Co., Ltd.).

It is possible to employ a host of known and industrially tried and tested cationic photoinitiators for epoxy resins for purposes of practicing the instant invention. Examples of these photoinitiators are onium salts with anions of weak nucleophilicity. Examples thereof are halonium salts, iodosyl salts or sulfonium salts, sulfoxonium salts, or diazonium salts, as described for example in U.S. Pat. No. 3,708,296. Other cationic photoinitiators are metallocene salts.

An overview of further commonplace onium salt initiators and/or metallocene salts is offered by "UV-Curing, Science and Technology", (Editor: S. P. Pappas, Technology Marketing Corp., 642 Westover Road, Stamford, Conn., USA) or "Chemistry & Technology of UV & EB Formulations for Coatings, Inks & Paints", Vol. 3 (edited by P. K. T. Oldring), which is incorporated herein by reference.

Preferred compositions comprising, as a cationic photoinitiator, a compound of the formula (B-I), (B-II) or (B-III)

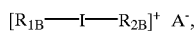
(B-I)

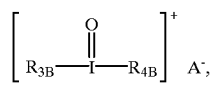
(B-II)

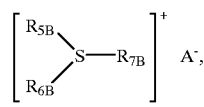
(B-III)

in which $R_{1B}$, $R_{2B}$, $R_{3B}$, $R_{4B}$, $R_{5B}$, $R_{6B}$, and $R_{7B}$ independently of one another are $C_6$–$C_{18}$aryl which is unsubstituted or substituted by appropriate radicals, and $A^-$ is $CF_3SO_3$ or an anion of the formula $[LQ_{mB}]$, where L is boron, phosphorus, arsenic or antimony, Q is a halogen atom, or some of the radicals Q in an anion $LQ_m^-$ may also be hydroxyl groups, and mB is an integer corresponding to the valency of L enlarged by 1.

Examples of $C_6$–$C_{18}$aryl in this context are phenyl, naphthyl, anthryl and phenanthryl. In these substituents present for appropriate radicals are alkyl, preferably $C_1$–$C_6$alkyl, such as methyl, ethyl, n-propyl, isopropyl, n-butyl, sec-butyl, isobutyl, tert-butyl or the various pentyl or hexyl isomers, alkoxy, preferably $C_1$–$C_6$alkoxy, such as methoxy, ethoxy, propoxy, butoxy, pentoxy or hexoxy, alkylthio, preferably $C_1$–$C_6$alkylthio, such as methylthio, ethylthio, propylthio, butylthio, pentylthio or hexylthio, halogen, such as fluorine, chlorine, bromine or iodine, amino groups, cyano groups, nitro groups or arylthio, such as pherylthio. Examples of preferred halogen atoms Q are chlorine and, in particular, fluorine. Preferred anions $LQ_{mB}$ are $BF_4^-$, $PF_6^-$, $AsF_6^-$, $SbF_6^-$ and $SbF_5(OH)^-$.

Particularly preferred compositions are those comprising as a cationic photoinitiator a compound of the formula (B-III), in which $R_{5B}$, $R_{6B}$ and $R_{7B}$ are aryl, aryl being in particular phenyl or biphenyl or mixtures of these two groups.

Further preferred compositions are those comprising as a photoinitiator a compound of the formula (B-IV)

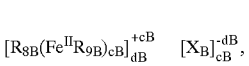
(B-IV)

in which cB is 1 or 2, dB is 1, 2, 3, 4 or 5,

XB is a non-nucleophilic anion, especially $PF_6^-$, $AsF_6^-$, $SbF_6^-$, $CF_3SO_3^-$, $C_2F_5SO_3^-$, n-$C_3F_7SO_3^-$, n-$C_4F_9SO_3^-$, n-$C_6F_{13}SO_3^-$ and n-$C_8F_{17}SO_3^-$, $R_{8B}$ is a π-arene and $R_{9B}$ is an anion of a π-arene, especially a cyclopenadienyl anion.

Examples of π-arenes as $R_{8B}$ and anions of π-arenes as $R_{9B}$ can be found in EP-A-0 094 915. Examples of preferred π-arenes as $R_{8B}$ are toluene, sylene, ethylbenzene, cumene, methoxybenzene, methylnaphthalene, pyrene, perylene, stilbene, diphenylene oxide and diphenylene sulfide. Cumene, methylnaphthalene or stilbene are particularly preferred. Examples of non-nucleophilic anions $X^-$ are $FSO_3^-$, anions of organic sulfonic acids, of carboxylic acids or of anions $LQ_{mB}^-$. Preferred anions are derived from partially fluoro- or perfluoro-aliphatic or partially fluoro- or perfluoro-aromatic carboxylic acids such as $CF_3SO_3^-$, $C_2F_5SO_3^-$, n-$C_3F_7SO_3^-$, n-$C_4F_9SO_3^-$, n-$C_6F_{13}SO_3$, n-$C_8F_{17}SO_3^-$, or in particular from partially fluoro- or perfluoro-aliphatic or partially fluoro- or perfluoro-aromatic organic sulfonic acids, for example from $C_6F_5SO_3^-$, or preferably are anions $LQ_{mB}^-$, such as $BF_4^-$, $PF_6^-$, $AsF_6^-$, $SbF_6^-$, and $SbF_5(OH)^-$. Preference is given to $PF_6^-$, $AsF_6^-$, $SbF_6^-$, $CF_3SO_3^-$, $C_2F_5SO_3^-$, n-$C_3F_7SO_3^-$, n-$C_4F_9SO_3^-$, n-$C_6F_{13}SO_3^-$ and n-$C_8F_{17}SO_3^-$.

The metallocene salts can also be employed in combination with oxidizing agents. Such combinations are described in EP-A-0 126 712.

In order to increase the light yield it is possible, depending on the type of initiator, also to employ sensitizers. Examples of these are polycyclic aromatic hydrocarbons or aromatic keto compounds. Specific examples of preferred sensitizers are mentioned in EP-A-0 153 904.

More preferred commercial cationic photoinitiators are UVI-6974, UVI-6970, UVI-6960, UVI-6990 (manufactured by Union Carbide Corp.), CD-1010, CD-1011, CD-1 012 (manufactured by Sartomer Corp.), Adekaoptomer SP-150, SP-151, SP-170, SP-171 (manufactured by Asahi Denka Kogyo Co., Ltd.), Irgacure 261 (Ciba Specialty Chemicals Corp.), CI-2481, CI-2624, CI-2639, CI-2064 (Nippon Soda Co, Ltd.), DTS-102, DTS-103, NAT-1 03, NDS-103, TPS-103, MDS-103, MPI-103, BBI-103 (Midori Chemical Co, Ltd.). Most preferred are UVI-6974, CD-1010, UVI-6970, Adekaoptomer SP-170, SP-171, CD-1012, and MPI-103. The above-mentioned cationic photo-initiators can be used either individually or in combination of two or more.

It is possible to employ all types of photoinitiators which form free radicals given the appropriate irradiation. Typical representatives of free-radical photoinitiators are benzoins, such as benzoin, benzoin ethers, such as benzoin methyl ether, benzoin ethyl ether and benzoin isopropyl ether, benzoin phenyl ether and benzoin acetate, acetophenones, such as acetophenone, 2,2-dimethoxy-acetophenone and 1,1-dichloroacetophenone, benzil, benzil ketals, such as benzil dimethylketal and benzil diethyl ketal, anthraquinones, such as 2-methylanthraquinone, 2-ethylanthra-quinone, 2-tert-butylanthraquinone, 1-chloroanthraquinone and 2-amylanthraquinone, and also triphenylphosphiie, benzoylphosphine oxides, for example 2,4,6-trimethylbenzoyl-diphenylphosphine oxide (Luzirin® TPO), bisacylphosphine oxides, benzophenones, such as benzophenone and 4,4'-bis(N,N'-dimethylamino) benzophenone, thioxanthones and xanthones, acridine derivatives, phenazine derivatives, quinoxaline derivatives or 1-phenyl-1,2-propanedione 2-O-benzoyl oxime, 1-aminophenyl ketones or 1-hydroxy phenyl ketones, such as 1-hydroxycyclohexyl phenyl ketone, phenyl 1-hydroxyisopropyl ketone and 4-isopropylphenyl 1-hydroxyisopropyl ketone, all of which constitute known compounds.

Particularly suitable free-radical photoinitiators which are used customarily in combination with an He/Cd laser as light source are acetophenones, such as 2,2-dialkoxybenzophenones and 1-hydroxy phenyl ketones, for example 1-hydroxycyclohexyl phenyl ketone or 2-hydroxyisopropyl phenyl ketone (=2-hydroxy-2,2-dimethylacetophenone), but especially 1-hydroxycyclohexyl phenyl ketone.

A class of photoinitiators that are commonly employed when using argon ion lasers comprises the benzil ketals, for example benzil dimethyl ketal. In particular, the photoinitiator used is an α-hydroxy phenyl ketone, benzil dimethyl ketal or 2,4,6-trimethylbenzoyldiphenyl-phosphine oxide.

A further class of suitable photoinitiators constitutes the ionic dye-counterion compounds, which are capable of absorbing actinic radiation and of generating free radicals which are able to initiate the polymerization of the acrylates. The novel compositions containing ionic dye-counterion compounds can in this way be cured more variably with visible light in an adjustable wavelength range of 400–700 nm. Ionic dye-counterion compounds and their mode of action are known, for example U.S. Pat. Nos. 4,751,102, 4,772,530 and 4,772,541. Examples of suitable ionic dye-counterion compounds are the anionic dye-iodonium ion complexes, the anionic dye-pyryllium ion complexes and, in particular, the cationic dye-borate anion compounds of the following formula:

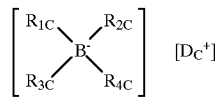

in which Dc$^+$ is a cationic dye and R$_{1C}$, R$_{2C}$, R$_{3C}$ and R$_{4C}$ independently of one another are each an alkyl, aryl, alkaryl, allyl, aralkyl, alkenyl, alkynyl, an alicyclic or saturated or unsaturated heterocyclic group. Preferred definitions for the radicals R$_{1C}$ to R$_{4C}$ can be taken for example, from EP-A-0 223 587.

As photoinitiator, the novel compositions preferably include a 1-hydroxy phenyl ketone, especially 1-hydroxycyclohexyl phenyl ketone.

The free radical and cationic photoinitiators are added in effective quantities, i.e. in quantities from 0.1 to 12, particularly from 0.5 to 9 percent by weight, based on the overall quantity of the composition. If the novel compositions are used for stereolithographic processes, in which laser beams are normally employed, it is essential for the absorption capacity of the composition to be matched, by way of the type and concentration of the photoinitiators, in such a way that the depth of curing at normal laser rate is from approximately 0.1 to 2.5 mm.

The novel mixtures may also contain various photoinitiators of different sensitivity to radiation of emission lines with different wavelengths to obtain a better utilization of a UV/VIS light source which emits emission lines of different wavelengths. In this context it is advantageous for the various photoinitiators to be selected such, and employed in a concentration such, that equal optical absorption is produced with the emission lines used.

The optional free radically curable component preferably comprises at least one solid or liquid poly(meth)acrylates, for example, be di-, tri-, tetra- or pentafunctional monomeric or oligomeric aliphatic, cycloaliphatic or aromatic acrylates or methacrylates. The compounds preferably have a molecular weight of from 200 to 500.

Examples of suitable aliphatic poly(meth)acrylates are the triacrylates and trimethacrylates of hexane-2,4,6-triol, glycerol or 1,1,1-trimethylolpropane, ethoxylated or propoxylated glycerol or 1,1,1-trimethylolpropane, and the hydroxyl-containing tri(meth)acrylates which are obtained by reacting triepoxide compounds, for example the triglycidyl ethers of said triols, with (meth)acrylic acid. It is also possible to use, for example, pentaerythritol tetraacrylate, bistrimethylolpropane tetraacrylate, pentaerythritol rionohydroxytriacrylate or -methacrylate, or dipentaerythritol monohydroxypentaacrylate or -methacrylate.

It is additionally possible, for example, to use polyfunctional urethane acrylates or urethane methacrylates. These urethane (meth)acrylates are known to the person skilled in the art and can be prepared in a known manner by, for example, reacting a hydroxyl-terminated polyurethane with acrylic acid or methacrylic acid, cr by reacting an isocyanate-terminated prepolymer with hydroxyalkyl (meth)acrylates to give the urethane (meth)acrylate.

Examples of suitable aromatic tri(meth)acrylates are the reaction products of triglycidyl ethers of trihydric phenols and phenol or cresol novolaks containing three hydroxyl groups, with (meth)acrylic acid.

The (meth)acrylates used herein are known compounds and some are commercially available, for example from the SARTOMER Company under product designations such as SR®295, SR®350, SR®351, SR®367, SR®399, SR®444, SR®454 or SR®9041.

Preferred compositions are those in which the free radically curable component contains a tri(meth)acrylate or a penta(meth)acrylate.

Suitable examples of di(meth)acrylates are the di(meth) acrylates of cycloaliphatic or aromatic diols such as 1,4-dihydroxymethylcyclohexane, 2,2-b s(4-hydroxycyclohexyl)propane, bis(4-hydroxycyclohexyl)methane, hydroquinone, 4,4'-dihydroxybi-phenyl, bisphenol A, bisphenol F, bisphenol S, ethoxylated or propoxylated bisphenol A, ethoxylated or propoxylated bisphenol F or ethoxylated or propoxylated bisphenol S. Di(meth acrylates of this kind are known and some are commercially available.

Other di(meth)acrylates which can be employed are compounds of the formulae (F-I), (F-II), (F-III) or (F-IV)

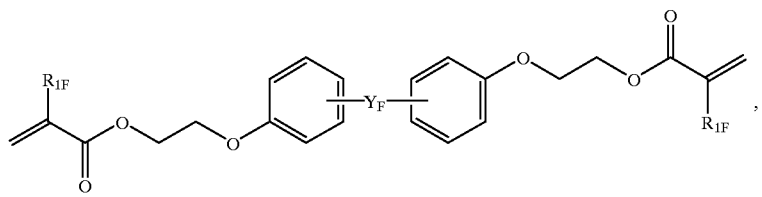
(F-I)
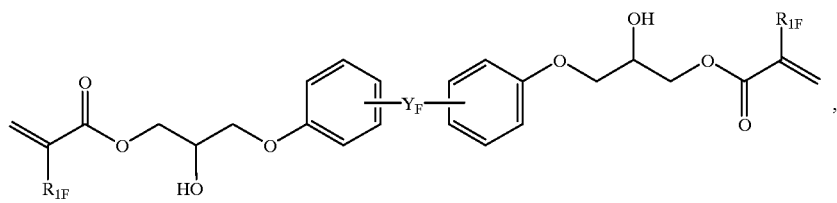
(F-II)
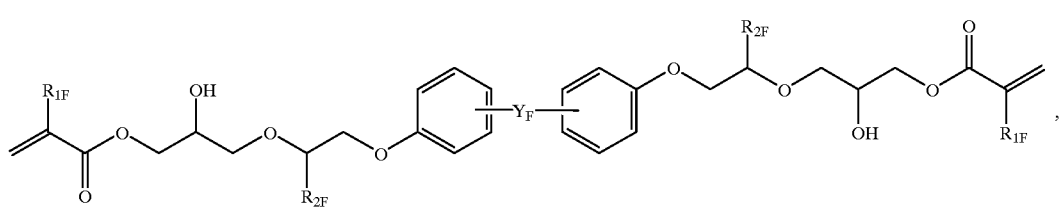
(F-III)
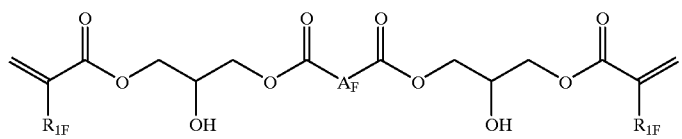
(F-IV)
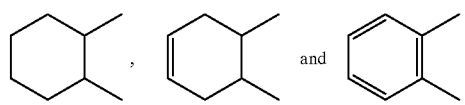
Further examples of possible di(meth)acrylates are compounds of the formulae (F-V), (F-VI), (F-VII) and (F-VIII)
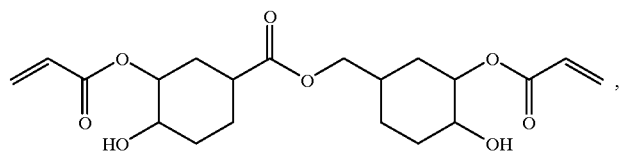
(F-V)

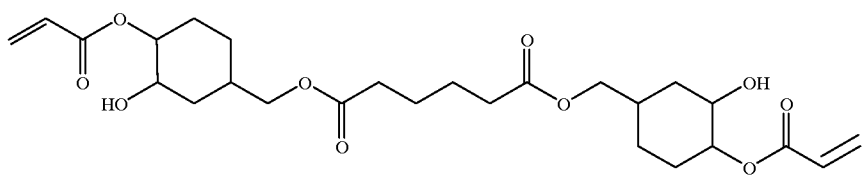

(F-VI)

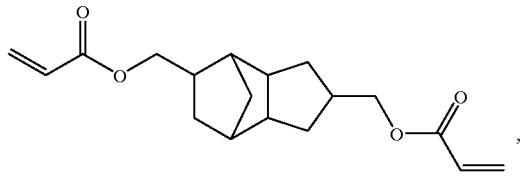

(F-VII)

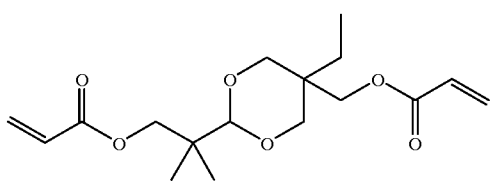

(F-VIII)

These compounds of the formulae (F-I) to (F-VIII) are known and some are commercially available. Their preparation is also described in EP-A-0 646 580.

Examples of commercially available products of these polyfunctional monomers are KAYARAD R-526, HDDA, NPGDA, TPGDA, MANDA, R-551, R-712, R-604, R-684, PET-30, GPO-303, TMPTA, THE-330, DPHA-2H, DPHA-2C, DPHA-21, D-310, D-330, DPCA-20, DPCA-30, DPCA-60, DPCA-120, DN-0075, DN-2475, T-1420, T-2020, T-2040, TPA-320, TPA-330, RP-1040, R-011, R-300, R-205 (Nippon Kayaku Co., Ltd.), Aronix M-210, M-220, M-233, M-240, M-215, M-305, M-309, M-310, M-315, M-325, M-400, M-6200, M-6400 (Toagosei Chemical Indtustry Co, Ltd.), Light acrylate BP-4EA, BP-4PA, BP-2EA, BP-2PA, DCP-A (Kyoeisha Chemical Industry Co., Ltd.), New Frontier BPE-4, TEICA, BR-42M, GX-8345 (Daichi Kogyo Seiyaku Co., Ltd.), ASF-400 (Nippon Steel Chemical Co.), Ripoxy SP-1506, SP-1507, SP-1509, VR-77, SP-4010, SP-4060 (Showa Highpolymer Co., Ltd.), NK Ester A-BPE-4 (Shin-Nakamura Chemical Industry Co., Ltd.), SA-1002 (Mitsubishi Chemical Co., Ltd.), Viscoat-195, Voscoat-230, Viscoat-260, Viscoat-310, Viscoat-214HP, Viscoat-295, Viscoat-300, Viscoat-360, Viscoat-GPT, Viscoat-400, Viscoat-700, Viscoat-540, Viscoat-3000, Viscoat-3700 (Osaka Organic Chemical Industry Co., Ltd.).

According to the present invention, it is preferrable that the radiation-curable and cationically polymerizable organic component (a) may optionally contain at least one component (a1) that is a polyfunctional aliphatic, alicyclic or aromatic glycidylether(s) having at least three epoxy groups per molecule. Component (a1) improves the side wall finish of the cured article and the wet recoatability of the liquid composition. More preferred compositions contain a component (a1) that is a polyfunctional aliphatic, alicyclic or aromatic glycidylether(s) having at least three epoxy groups per molecule with an epoxy equivalent weight (EEW) between 100 and 2000. Most preferred are those having an EEW weight between 100 and 800. As an example, the triglycidylether of trimethylolpropane, Heloxy 48 of Shell Corp., with EEW of about 140–160 is one of the most preferred polyglycidylether compounds. The polyfunctional glycidylether(s) having at least three epoxy groups in their molecule may comprise between about 2 and 90% by weight the overall cationic component of the composition. More preferred between about 5 and about 60% by weight. Most preferred between 7 and 40% by weight.

According to the present invention, it is preferrable that the radiation-curable and cationically polymerizable organic component (a) comprise at least one component (a2) that is an alicyclic polyepoxide having at least two epoxy groups per molecule. More preferred compositions contain component (a2) with monomer purity over 80%. As an example, 3,4-epoxycyclohexylmethyl 3',4'-epoxycyclohexanecarboxylate (ECEC) with varying degrees of purification can be purchased through various commercial sources. Preferred is Araldite CY179 of Ciba Specialty Chemicals Corporation, which is a ECEC containing a certain percentage of dimers or oligomers of about 10% or less. More preferred is UVR6105 of Union Carbide Corp., which is an ECEC containing a smaller percentage of oligomers than Araldite CY 179. As the purity of component (a2) increases, viscosity is lower. Applicants found that higher purity and lower viscosity range for component (a2) leads to improved photospeed of the overall liquid composition. Preferred compositions contain component (a2) between 5 to 80 % by weight. More preferred compositions contain component (a2) between 20 and 75% by weight. Most preferred compositions contain component (a2) between 25 to 70% by weight.

According to the present invention, it is preferrable that the radiation-curable and cationically polymerizable organic component (a) may optionally comprise at least one component (a3) that is a solid or liquid epoxycresol novolac or epoxycresol novolac having at least two epoxy groups per molecule. The epoxy equivalent weight of component (a3) is between 100 to 400 grams/equivalent Preferred amount for component (a3) is between 3 and 80% by weight. More preferred amount is between 6 to 75% by weight. The most preferred amount is between 10 to 40% by weight.

Preferred vinylethers are those having aliphatic, aromatic or alicyclic moities in their molecules. Preferred are also hydroxyl-functionalized vinylethers. Preferred amount of the vinylether component is between 1 to 40% by weight. More preferred amount is between 3 to 30% by weight. Most preferred amount is between 4 to 20% by weight.

According to the present invention, it is preferrable that radiation curable and radically-polymerizable organic component (e) be contained in amounts from 0.5 to 40% by weight. More referred compositions contain component (e) between 7 to 30% by weight. Most preferred are compositions containing component (e) between 8 to 20% by weight. Most preferred compositions contain 4 to 10% by weight of at least one liquid or solid poly(meth)acrylate having a (meth)acrylate functionaility of more than 2, and from 4 to 10% by weight of one or more di(meth)acrylates.

According to the present invention, it is preferrable that the radiation-curable composition may optionally comprise between 0.5 and 40% by weight at least one solid or liquid polyol component (f). More preferred compositions contain component (f) comprising aliphatic or alicyclic polyhydric alcohols bearing polyester, caprolactone, polyether, polyalkylene, polysiloxane derivatives, or mixtures thereof. Most preferred are compositions containing a polyol component (f) comprising substances having aromatic carbon rings in their molecules, in particular phenolic compounds having at least 2 hydroxyl groups, phenolic compounds having at least 2 hydroxyl groups, which are reacted with ethylene oxide, propylene oxide or with ethylene and propylene oxide, aliphatic hydroxy compounds having not more than 80 carbon atoms, compounds having at least one hydroxyl group and at least one epoxide group, or mixtures thereof. More preferred amount of polyol component (f) is between 3 and 30% by weight, and most preferred amount is between 5 and 25% by weight.

Preferred compositions contain component (b) that is a cationic photoinitiator or a mixture of cationic photoinitiators between 0.1 to 12% by weight. More preferred compositions contain component (b) between 0.2 to 9% by weight. Most preferred compositions contain component (b) between 0.25 to 8% by weight. It is preferred for component (d) that is a free-radical photoinitiator or a mixture of free-radical photoinitiators to be contained between 0.1 to 10% by weight. More preferred compositions contain component (d) between 0.3 to 5% by weight. Most preferred compositions contain component (d) between 0.4 to 4% by weight.

Preferred, more preferred and most preferred compositions may contain between 0 to 10% by weight of additives or reactive diluents.

The novel compositions herein further include a cationic reactive modifier (epoxy-, vinylether-, spiro-orthoester- or oxetane-based) or polyether-polyol modifier component. The cationic reactive modifier component imparts flexibility and impact resistance to the cured article without compromising photospeed of the liquid composition or water resistance of the cured article. The selected cationic reactive modifiers should be at least bifunctional compounds, more preferably aliphatic, alicyclic and/or aromatic compounds having, on average, at least two cationically reactive groups per molecule containing at least one chain extension segment with a molecular weight of at least about 100 and not more than 2000. Each chain extension segment is the organic or inorganic chain that connects the epoxide rings or vinylether groups or other cationically reactive groups with the core or backbone of the main molecule. The equivalent weight per epoxide can vary between about 180 and about 2000. The equivalent weight per vinylether group or any other cationically cured group can vary between about 100 and 1600. In an alternative embodiment, RCM comprises two reactive groups wherein at least one is a cationic reactive group and at least one is a hydroxyl- or epoxy-group. Examples include polyethylene glycol monovinylethers and polyalkylene alcohol mono(poly)vinylethers.

Cationic reactive modifiers having more than two cationically reactive groups and a corresponding number of chain extension segments are preferred. Preferred chain extension segments are (un)saturated unsubstituted aliphatic or (un)saturated aliphatic substituted with $C_1$–$C_{10}$alkyl or $C_1$–$C_{10}$alkoxy groups, unsubstituted cycloaliphatic or substituted cycloaliphatic with $C_1$–$C_{10}$alkyl or $C_1$–$C_{10}$alkoxy groups, unsubstituted aromatic or aromatic substituted with $C_1$–$C_{10}$alkyl or $C_1$–$C_{10}$alkoxy groups, saturated and unsaturated polyesters, polyethers, polysiloxanes, polysilanes, polycarbonates, polyalkylene ethers. A chain extension segment having 4 to 60 repeating $C_2$–$C_4$alkoxy groups, for example isopropoxy, propoxy and ethoxy, is most preferred. Similarly, for aromatic epoxides, the chain extension segment between the glycidyl ether groups and the aromatic nucleus of polyhydric alcohol should have a molecular weight of at least about 100 and not more than 2000.

Also preferred are polyglycidyl esters and poly($\beta$-methylglycidyl)esters having chain extension segments having a molecular weight of at least about 100 and not more than 2000. Said compounds can be obtained by reacting a compound having at least two carboxyl groups in the molecule with epichlorohydrin or glycerol dichlorohydrin or p-methylepichlorohydrin. Likewise, it is possible to employ cycloaliphatic polycarboxylic acids, for example tetrahydrophthalic acid. It is also possible to use aromatic polycarboxylic acids such as phthalic acid, pyromellitic acid, or else carboxyl-terminated adducts, for example of trimellitic acid and polyols, for example glycerol or 2,2-bis(4-hydroxycyclohexyl)propane.

Epoxidized oils (e.g. the Union Carbide FLEXOL, LOE or EPO) having chain extension segments having a molecular weight of at least about 400 and not more than 5,000 are also preferred epoxy-based cationic reactive modifiers.

A more preferred epoxy-based cationic reactive modifier is a liquid or solid polyglycidyl ether of a polyhydric alcohol or adducts or a polybasic acid thereof with alkylene oxide (e.g. triglycidyl ether of glycerol chain extended by between five and fourteen isopropoxy groups per glycidyl ether group). Also preferred is a dimer acid diglycidylether having an aliphatic backbone of between about $C_{15}$ to about $C_{150}$, such as Heloxy® 71 having an aliphatic backbone of about $C_{34}$, polyglycol diepoxides having a backbone consisting between about 4 and 50 isopropoxy units, such as Heloxy® 32, with 7 isopropoxy groups, polyglycidylethers of castor oil, such as Heloxy® 505, all three products are commercially available by Shell Corp., Houston, Tex. The most preferred epoxy-based cationic reactive modifier is a triglycidyl ether of polypropoxylated glycerol having the following structure:

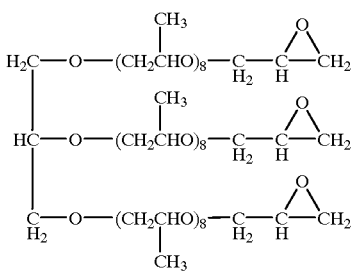

which is commercially available under the tradename Heloxy® 84 from Shell Company, Houston, Tex.

Other preferred cationic reactive modifiers are based: on liquid or solid vinyl ethers, such as polyalkylene glycol di-(poly) vinyl ether, polyalkoxy vinylethers of polyhydric alcohols, polyalkoxy alcohol mono(poly)vinylethers, tetraethyleneglycol divinylether; also cycloaliphatic or aromatic (di)polyvinyl ethers chain extended with at least one chain extension segment. Preferred chain extension segments are saturated and/or unsaturated unsubstituted aliphatic or aliphatic substituted with $C_1$–$C_{10}$alkyl or $C_1$–$C_{10}$alkoxy groups, unsubstituted cycloaliphatic or cycloaliphatic substituted with $C_1$–$C_{10}$alkyl or $C_1$–$C_{10}$alkoxy groups, unsubstituted aromatic or aromatic substituted with $C_1$–$C_{10}$alkyl or $C_1$–$C_{10}$alkoxy- groups, saturated and unsaturated polyesters, polyethers, polysiloxanes, polysilanes, polycarbonates, polyalkylene ethers. The vinylether-based cationic reactive modifier should be at least bifunctional. A chain extension segment having 4 to 80 repeating $C_2$–$C_4$alkoxy groups, for example isopropoxy, propoxy and ethoxy, is most preferred.

The reactive polyether-polyol modifier (PEPO) component can be solid or liquid at room temperature and preferably is characterized by following formula:

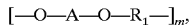

where m is such that the molecular weight of PEPO is greater than or equal to about 4000. A is a para, meta or ortho substituted aromatic diol residue, said aromatic diols preferably are Bisphenol A, Bisphenol F. p, m, o-Biphenyl, p-, m-, o-Hydroquinone, substituted with aliphatic or aromatic substituents, para, meta and ortho substituted aromatic structures of the following structure:

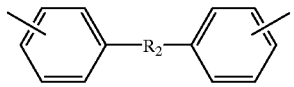

where the linkage $R_2$ is a direct bond, or at least one —O—, —$SO_2$—, —CO—, —COO—, —$OCH_2$—, —$OCX_1X_2$—,—$CX_1X_2$— wherein $X_1$ and $X_2$ independently of one another can be hydrogen and $C_1$–$C_3$alkyl.

Substituents on the aromatic ring(s) of the above chemical structure independently from one another can be hydrogen, $C_1$–$C_5$alkyl, alkoxy, nitro, carboxylic, ester, and hydroxyl groups.

In the alternative, A can be an unsubstituted or substituted (un)saturated aliphatic or alicyclic or aromatic diol residue linked with saturated and/or unsaturated chain extension segment having 1 to 100 repeating $C_1$–$C_4$ alkylgroups or alkoxy groups, ether group, oxytetramethylene, ester, sulfone, sulfoxide, siloxane and carbonate. Substituents for said diol residue are $C_1$–$C_6$alkyl and $C_1$–$C_6$alkoxy. Preferred examples of alicyclic diols include hydrogenated Bisphenol A and hydrogenated Bisphenol F.

$R_1$ can be represented by the formula:

where n is greater than or equal to 1, $R_3$ and $R_4$ are independently of one another are hydrogen, $C_1$–$C_8$alkyl, $C_5$–$C_{12}$ cycloaliphatic, $C_5$–$C_{12}$ aromatic ring containing aromatic ether, aliphatic ether, $C_2$–$C_4$alkoxy, oxytetramethylene, aliphatic or aromatic ester, siloxane and carbonate linkages.

More preferably, the polyether polyol modifier has the formula

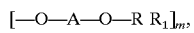

wherein the molecular weight of the polyether polyol is greater than or equal to about 4000, A is an aromatic diol residue and $R_1$ is —$CH_2CH(OH)CH_2$—.

Most preferably, PEPO is a polyarylether polyol modifier having the formula:

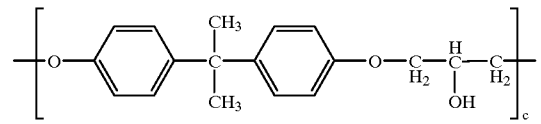

where c is about 15 to greater than 60. The end-groups of the above-drawn polymer structure depend on the feeding ratio of the raw materials during the manufacturing process, reaction conditions, and purity of the raw materials. The end-groups can be tailored based on specific chemistry and applications. PEPO may be in a liquid or solid form at room temperature. Most preferred PEPOs include PKHM-85X, PKHC, PKHH, PKHJ, PKHM-30, PKHM-301, PKFE all of Phenoxy Specialties, Corp., NC. These specific candidates have a molecular weight between 10,000 and 20,000. To impart specific properties or degree of compatibility, PEPO may be dissolved or diluted with commercial diols or triols or polyols to form from low to high viscous intermediates suitable as flexibilizers and tougheners. As an example, Paphen PKHM-85X is a mixture of a solid paphen phenoxy with a liquid commercial polyol.

Depending on the polarity of the composition, the chain extension segment can be chosen in such a way that the cationic reactive modifier is highly compatible with the liquid curable composition. Such a selection results in, not only an improvement in elongation and impact resistance, but improved recoatability and elimination of undesirable phase separation phenomena. In the case of slightly polar liquid compositions, the chain extension segment may be an ethoxy or propoxy or isopropoxy or oxytetramethylene or derivatives thereof. In addition to high flexibility, if there is a need for imparting water resistance into the composition, then the aromatic or hydrocarbon or isopropoxy or low ether content chain extenders are most preferred.

The cationic reactive modifiers and polyether-polyol modifiers are preferably present in the overall composition at between about 0.5% to about 60% by weight, more preferably about 1% to about 50% by weight, most preferably about 2% to 30 by weight. The solid or liquid reactive cationically modifiers and polyether-polyol modifiers may be used singly or as a mixture.

The novel compositions optionally comprise at least one compound selected from the group consisting of: dihydroxybenzenes, trihydroxybenzenes and the compounds of the formula (D-I):

(D-I)
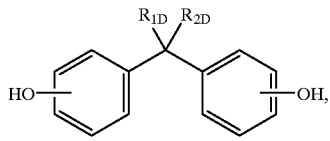

in which $R_{1D}$ and $R_{2D}$ are a hydrogen atom or a methyl group; compounds of the formula (D-II):

(D-II)
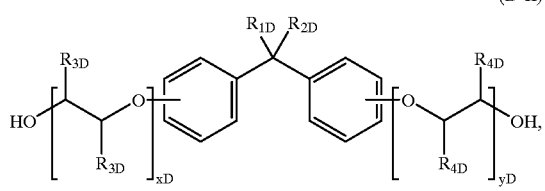

in which $R_{1D}$ and $R_{2D}$ are each a hydrogen atom or a methyl group;

$R_{3D}$ and $R_{4D}$ are all, independently of one another, a hydrogen atom or a methyl group, and xD and yD are each an integer from 1 to 15;

trimethylolpropane, glycerol, castor oil and the compounds of the formula (D-III) and (D-IV):

(D-III)
[HO]$_{zD}$—R$_{5D}$, (D-IV)
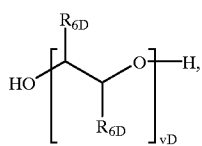

in which $R_5D$ is an unbranched or branched (zD)-valent $C_2$–$C_{20}$alkane residue, preferably a (zD)-valent $C_2$–$C_6$alkane residue, all radicals $R_{6D}$, independently of one another, are a hydrogen atom or a methyl group, zD is an integer from 1 to 4 and vD is an integer from 2 to 20; and also compounds of the formulae (D-V), (D-VI), (D-VII), (D-VIII) (D-IX) and (D-X):

(D-V)
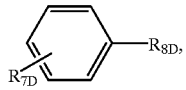

(D-VI)
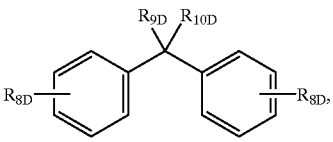

(D-VII)
($C_3$–$C_{20}$alkyl)-$R_{8D}$, (D-VIII)
$R_{8D}$——($C_3$–$C_{20}$alkylene)-$R_{8D}$, (D-IX)
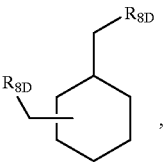

(D-X)
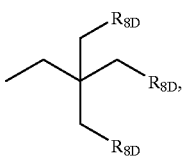

in which $R_{7D}$, $R_{9D}$ and $R_{10D}$ are each a hydrogen atom or a methyl group and each $R_{8D}$ is a group selected from the groups of the formulae (D-XI), (D-XII), (D-XIII) and (D-XIV):

(D-XI)
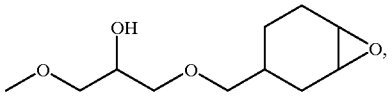

(D-XII)
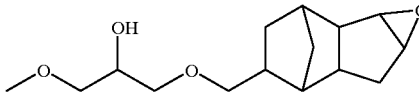

(D-XIII)
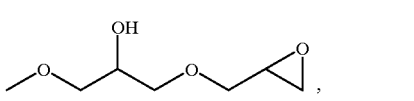

(D-XIV)
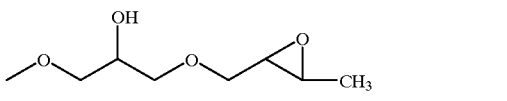

The compounds of the above formulae (D-I), (D-II), (D-V), (D-VI) and (D-IX) are preferably the respective 1,4 derivatives or bis-1,4 derivatives. The compounds of the formulae (D-I) to (D-X) and methods for their preparation are known to the person skilled in the art.

The optional polyol component can consist of (D2) phenolic compounds having at least 2 hydroxyl groups which are reacted with ethylene oxide, propylene oxide or with ethylene oxide and propylene oxide, and especially of the compounds of the formula (D-IIa):

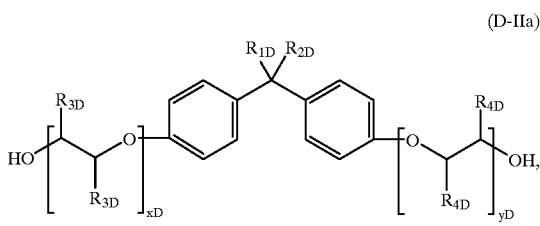

(D-IIa)

in which $R_{1D}$ and $R_{2D}$ are both a hydrogen atom or both a methyl group;

$R_{3D}$ and $R_{4D}$ are all, independently of one another, each a hydrogen atom or a methyl group, and xD and yD are each an integer from 1 to 15.

The optional polyol component can also comprise hydroxyl group containing polyester compounds obtained by esterifying at least one aliphatic polyhydric alcohol with at least one monobasic acid, polybasic acid, or phenol and the hydroxyl group-containing polyesters obtained through an esterification reaction between at least one lactone compound and at least one monobasic acid, polybasic acid or phenol. As said aliphatic polyhydric alcohol, 1,3-butanediol, 1,4-butanediol, 1,6-hexanediol, diethylene glycol, triethylene glycol, neopentyl glycol, polyethylene glycol, polypropylene glycol, trimethylolpropane, glycerin, pentaerythritol and dipentaerythritol can be used, for example. As said monobasic acid, formic acid, acetic acid, butylcarboxylic acid, and benzoic acid can be used, for example. As said polybasic acid, adipic acid, terephthalic acid, phthalic anhydride and trimellitic acid can be used, for example. As said phenol, phenol, p-nonylphenol, bisphenol A and bisphenol F can be used, for example. As said lactone, β-propiolactone and ε-caprolactone can be used, for example. Other suitable compounds include caprolactone based oligo- and polyesters such as the trimethylolpropane triester with caprolactone, Tone 0301 and Tone 0310, or the Tone 02xx series of Union carbide Corp.

As said polyester polyols, the Desmophen series of Bayer Corp., K-Flex series of King Industries, Corp., the Rucoflex series of Ruco Polymer Corp., the Fomrez series of Witco Corp., and the Capa series of Solvay Corp. can also be used. The hydroxyl group-containing polyester can be used either singly or in combination of two or more in accordance with the properties desired. The optional polyol component can also comprise hydroxyfunctional polyetheralcohols, such as alkoxylated trimethylolpropane, alkoxylated bisphenol A, alkoxylated bisphenol F, polytetramethyleneether glycol known as polybutylene glycol (molecular weight between 250 and 9000), in particular the propoxylated, isopropoxylated and ethoxylated compounds, polyethyleneglycol –200 or –600 and the like. Polyether alcohols also include the Desmophen U&L and the Mutranol series of Bayer Corp., the Voranol series of Dow Corp. and the Arcol series of Arco Corp. The preferable molecular weight of the polyol should be about 100 to 2000, and more preferably about 160–1000.

In a preferred embodiment, the hybrid cationically and radically cured composition does not include the optional polyol component. It has been widely accepted that hydroxyl group-containing compounds are a must component for epoxy hybrid compositions used in stereolithography. It was believed that epoxy formulations do not cure and postcure to high extent unless the composition contains a certain percentage of a diol, triol or polyol. The presense of diols or polyols was believed to be a major factor for obtaining UV cured articles with exceptionally good mechanical and thermomechanical properties. The hydroxyl groups react with the epoxy groups during the epoxy ring opening, and contribute to the formation of a three dimensional network. A recent application WO 97/38354 (16 October, 1997) to DSM Corp., Japan Synthetic Rubber Co., Ltd., Japan Fine Coatings Co., Ltd. teaches that a diol or triol or polyol component is necessary to be present in hybrid liquid composition at a concentration above a critical one. This patent also teaches that "if the proportion of the polyol component is too low, the aim of developing the photocuring characteristic can not be achieved and there are cases where a three-dimensional object with sufficient stability in shape and properties can not be produced from the resin composition". Applicants herein have been able to obtain highly crosslinked networks with good mechanical and thermomechanical properties by photopolymerizing hybrid epoxy compositions with no diol or triol or polyol. The non polyol-containing liquid hybrid compositions used in stereolithography can be readily flexibilized using the cationic reactive and/or polyarylether-polyol modifiers described herein and following examples.

If necessary, the resin composition for stereolithography applications according to the present invention may contain other materials in suitable amounts, as far as the effect of the present invention is not adversely affected. Examples of such materials include radical-polymerizable organic substances other than the aforementioned cationically polymerizable organic substances; heat-sensitive polymerization initiators, various additives for resins such as coloring agents such as pigments and dyes, antifoaming agents, leveling agents, thickening agents, flame retardant and antioxidant; fillers such as silica, alumina, glass powder, ceramic powder, metal powder and modifier resins. Particular examples of the radical-polymerizable organic substances include but not limited to compounds that thermally polymerize, while those of the heat-sensitive polymerization initiator includes aliphatic onium salts disclosed in Japanese Patent Laid-Open Nos. 49613/1982 and 37004/1983.

The filler to be used in the present invention is a reactive or non-reactive, inorganic or organic, powdery, fibrous or flaky material. Examples of organic filler materials are polymeric compounds, thermoplastics, core-shell, aramid, kevlar, nylon, crosslinked polystyrene, crosslinked poly (methyl methacrylate), polystyrene or polypropylene, crosslinked polyethylene powder, crosslinked phenolic resin powder, crosslinked urea resin powder, crosslinked melamine resin powder, crosslinked polyester resin powder and crosslinked epoxy resin powder. Examples of inorganic fillers are glass or silica beads, calcium carbonate, barium sulfate, talc, mica, glass or silica bubbles, zirconium silicate, iron oxides, glass fiber, asbestos, diatomaceous earth, dolomite, powdered metals, titanium oxides, pulp powder, kaoline, modified kaolin, hydrated kaolin metallic filers, ceramics and composites. Mixtures of organic and/or inorganic fillers can be used.

Further examples of preferred fillers are micro crystalline silica, crystalline silica, amorphous silica, alkali alumino silicate, feldspar, woolastonite, alumina, aluminum hydroxide, glass powder, alumina trihydrate, surface treated alumina trihydrate, alumina silicate. Each of the preferred fillers is commercially available. The most preferred filler materials are inorganic fillers, such as Imsil, Novasite, mica, amorphous silica, feldspar, and alumina trihydrate. Mica as a filler is very attractive because it shows low tendency to settle out from the photocurable compositions. It has transparency to UV light, low tendency to refract or reflect incident light and it provides good dimensional stability and heat resistance.

The filler to be used for the resin composition for stereolithography according to the present invention must satisfy requirements that it hinders neither cationic nor radical polymerizations and the filled SL composition has a relatively low viscosity suitable for the stereolithography process. These fillers may be used alone or as a mixture of two or more of them depending upon the desired performance. The fillers used in the present invention may be neutral acidic or basic. The filler particle size may vary depending on the application and the desired resin characteristics. It may vary between 50 nanometers and 50 micrometers.

The filler material can optionally be surfaced treated with various compounds-coupling agents. Examples include methacryloxy propyl trimethoxy silane, beta-(3,4-epoxycyclohexyl)ethyl trimethoxy silane, gamma-glycidoxy propyl trimethoxy silane and methyl triethoxy silane. The most preferred coupling agents are commercially available from Osi Chemicals Corp. and other chemical suppliers.

The filler loading is preferably from about 0.5 to about 90%, more preferably from about 5 to about 75%, most preferably from about 5 to about 60% by weight with respect to the total weight of the filled resin composition.

The novel compositions can be prepared in a known manner by, for example, premixing individual components and then mixing these premixes, or by mixing all of the components using customary devices, such as stirred vessels, in the absence of light and, if desired, at slightly elevated temperature.

The novel compositions can be polymerized by irradiation with actinic light, for example by means of electron beams, X-rays, UV or VIS light, preferably with radiation in the wavelength range of 280–650 nm. Particularly suitable are laser beams of HeCd, argon or nitrogen and also metal vapor and NdYAG lasers. This invention is extended throughout the various types of lasers existing or under development that are to be used for the stereolithography process, e.g. solid state, argon ion, helium cadmium lasers, etc. The person skilled in the art is aware that it is necessary, for each chosen light source, to select the appropriate photoinitiator and, if appropriate, to carry out sensitization. It has been recognized that the depth of penetration of the radiation into the composition to be polymerized, and also the operating rate, are directly proportional to the absorption coefficient and to the concentration of the photoinitiator. In stereolithography it is preferred to employ those photoinitiators which give rise to the highest number of forming free radicals or cationic particles and which enable the greatest depth of penetration of the radiation into the compositions which are to be polymerized.

The invention additionally relates to a method of producing a cured product, in which compositions as described above are treated with actinic radiation. For example, it is possible in this context to use the novel compositions as adhesives, as coating compositions, as photoresists, for example as solder resists, or for rapid prototyping, but especially for stereolithography. When the novel mixtures are employed as coating compositions, the resulting coatings on wood, paper, metal, ceramic or other surfaces are clear and hard. The coating thickness may vary greatly and can for instance be from 0.01 mm to about 1 mm. Using the novel mixtures it is possible to produce relief images for printed circuits or printing plates directly by irradiation of the mixtures, for example by means of a computer-controlled laser beam of appropriate wavelength or employing a photomask and an appropriate light source.

One specific embodiment of the abovementioned method is a process for the stereolithographic production of a three-dimensional shaped article, in which the article is built up from a novel composition with the aid of a repeating, alternating sequence of steps (a) and (b); in step (a), a layer of the composition, one boundary of which is the surface of the composition, is cured with the aid of appropriate radiation within a surface region which corresponds to the desired cross-sectional area of the three-dimensional article to be formed, at the height of this layer, and in step (b) the freshly cured layer is covered with a nevi layer of the liquid, radiation-curable composition, this sequence of steps (a) and (b) being repeated until an article having the desired shape is formed. In this process, the radiation source used is preferably a laser beam, which with particular preference is computer-controlled.

In general, the above-described initial radiation curing, in the course of which the so-called green models are obtained which do not as yet exhibit adequate strength, is followed then by the final curing of the shaped articles by heating and/or further irradiation.

The term "liquid" in this application is to be equated with "liquid at room temperature" in the absence of any statement to the contrary, room temperature being understood as being, in general, a temperature between 5° and 45° C., preferably between 150 and 30° C.

EXAMPLES

Representative embodiments of the present invention will be described as examples, though the present invention is by no means limited by them. In the following example 1, all parts are by weight. Base Resin SL 5210, available from Ciba Specialty Chemicals Corporation, Los Angeles, Calif. is a mixture of a multifunctional epoxy resin, vinyl ether-based resin and a mixture of polyacrylate components. Cationic reactive modifier is Heloxy 84, a triglycidylether of glycerol having chain extension segments comprising 8 isopropoxy linkages. Heloxy 84 is a commercial product of Shell Corp., Houston, Tex. The polyaryletherpolyol reactive modifier, PEPO, is a copolymer or homopolymer of Bisphenol A with epichlorohydrin. It is a commercial product under the tradename Paphen PKHM-85X of Phenoxy Specialties Corp., NC. It is believed to be a mixture of a solid polyetherpolyol Paphen with a liquid commercial polyol based on information provided by the manufacturer.

The formulations indicated in the examples are prepared by mixing the components, with a stirrer at between 20 and 80° C. depending on the viscosity of the various components until a homogeneous composition is obtained. Most compositions are mixed at a room temperature of about 25 to 30° C. The physical data relating to the formulations are obtained as follows:

The mechanical properties of the formulations are determined on three-dimensional specimens produced with the aid of an He/Cd laser. In particular, the window panes (for measuring photospeed), dogbone and Izod impact specimens were built in a 3D Systems SL 250/30 sterelithography machine using a helium cadium laser emitting at 325 nm. To measure the elongation at break, four dogbones 12 centimeters long were built. The impact resistance bars had a thickness of 0.15 inches and were notched in an automatic notcher machine. The dogbone and Izod impact bars were postcured with ultraviolet energy for 90 minutes in a conventional UV postcuring apparatus.

The photosensitivity of the formulations is determined on so-called window panes. In this determination, single-layer test specimens are produced using different laser energies, and the layer thicknesses obtained are measured. The plotting of the resulting layer thickness on a graph against the logarithm of the irradiation energy used gives a "working curve". The slope of this curve is termed Dp (given in mm or mils). The energy value at which the curve passes through the x-axis is termed Ec (and is the energy at which gelling of the material still just takes place; cf. P. Jacobs, Rapid Prototyping and Manufacturing, Soc. of Manufacturing Engineers, 1992, p. 270 ff.).

Example 1

Liquid composition 1 comprises 100% the Base Resin. Liquid compositions 2 and 3 are prepared by mixing 17% of Heloxy 84 or Paphen 85X, respectively, with 83% Base Resin, and stirring the mixture at 45° C. for 3 hours. Afterwards, all three liquid compositions were evaluated in a stereolithography machine SL 250/30 using a helium cadmium laser. The experimental data is shown in Table 1.

TABLE 1

| Resin No. | | Dp, mils | Ec (mJ/cm$^2$) | Elongation at Break, % | Izod Impact Resistance, ft./lb/in. |
|---|---|---|---|---|---|
| 1. | Base Resin | 5.43 | 7.80 | 1.20 | 0.35 |
| 2. | RCM | 6.14 | 6.53 | 8.5 | 0.65 |
| 3. | PEPO | 5.88 | 5.56 | 18 | 0.84 |

It can be seen from Table 1 that Resin No.2 comprising the cationic reactive modifier shows over seven times improvement in elongation at break compared to the selected Base Resin No.1. Furthermore, the Izod impact resistance has been improved by 85% relative to the Base Resin. Similarly, Resin No. 3 comprising PEPO shows 15 times improvement in elongation at break relative to the Base Resin, and 140% improvement in Izod impact resistance. The increase in elongation and impact resistance by using the aforementioned reactive modifiers does not come at the expense of a reduced photospeed, which is the usual result of the addition of conventional flexibilizers. On the contrary, the photospeed increased, as well. Table 1 shows that the Dp values of Resins No. 2 and No.3 comprising the cationic reactive modifier and PEPO-containing compounds, respectively, are higher than the corresponding values for the Base Resin No. 1, and their Ec values are lower These numbers prove that the flexibilized modified resins containing either the cationic reactive modifier or PEPO show higher photospeed than the Base Resin.

What is claimed is:

1. A method for producing three-dimensional shaped articles comprising:

a) treating a radiation-curable composition comprising:
      1) from 20 to 90 percent by weight of actinic radiation-curable and cationically polymerizing organic compounds;
      2) from 0.05 to 12 percent by weight of a cationic initiator;
      3) from 0.5 to 60 percent by weight of at least one cationic reactive modifier represented by the following formula:

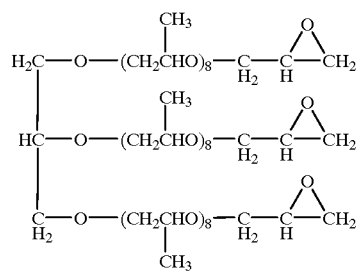

or at least one polyether polyol component having a molecular weight greater than or equal to about 4,000; or mixtures thereof with actinic radiation to form an at least partially cured layer on the surface of said composition within a surface region corresponding to a desire(cross-sectional area of the three-dimensional article to be formed, b) covering the at least partially cured layer Produced in step (a) with a new layer of said radiation-curable composition, and c) repeating steps (a) and (b) until an article having the desired shape is formed, and optionally, d) post-curing the resulting article.

2. A method according to claim 1 wherein the actinic radiation-curable and cationically polymerizable organic substance comprises 10 to 80% by weight of at least one solid or liquid cycloaliphatic polyepoxide having at least two epoxy groups with epoxy equivalent weight between 70 and 350 g/eq, or mixtures thereof.

3. A method according to claim 1 wherein the actinic radiation-curable and cationically polymerizable organic substance comprises 3 to 70% by weight of at least one solid or liquid polyglycidylether of aliphatic, alicyclic or aromatic alcohol or polybasic acid, epoxy cresol novolac, epoxyphenol novolac, spiro-orthoester compounds, oxetane compounds, having at least two cationically reactive groups per molecule, or mixtures thereof.

4. A method according to claim 1 wherein the actinic radiation-curable and cationically polymerizable organic substance comprises 0.5 to 40% by weight of at least one solid or liquid vinylether having at least two vinylether groups or at least a hydroxyl-functionalized vinyl ether.

5. A method according to claim 1 wherein the composition contains about 3 to 40% A by weight of a free radically curable component containing at least one mono- or pole (meth)acrylate.

6. A method according to claim 1 wherein the composition comprises from about 1 to about 60 percent by weight of cationic reactive modifier.

7. A method according to claim 1 wherein the polyether-polyol component has the following formula:

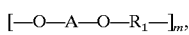

where m is such that the molecular weight of the polyether polyol is greater than or equal to 4,000, A is para-, meta- or ortho- substituted aromatic diol residue selected from Bisphenol A, Bisphenol F, p, m, o-Biphenyl, p-, m-,o-Hydroquinone, substituted with aliphatic or aromatic substituents having (un)saturated $C_1$–$C_5$alkylgroups, ether- or ester-groups; para, meta and ortho substituted aromatic structures of the following structure:

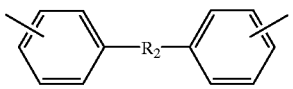

where $R_2$ is at least one —O—, —SO$_2$—, —CO—, —COO—, —OCH$_2$—, —CH$_2$—, (CH$_3$)$_2$C<, and an aliphatic or aromatic chain extension segment having 1 to 100) repeating $C_1$–$C_4$ units of saturated and/or unsaturated alkyl-, alkoxy-, aryloxy-, ethoxy, propoxy, isopropoxy, oxytetramethylene, aliphatic or aromatic ester, siloxane and carbonate linkages, $R_1$ is CH$_2$CH(OH)(CR$_3$R$_4$)$_n$⁻, where n is greater than or equal to 1, $R_3$ and $R_4$ are independently of one another —H, —CFH$_3$, —CH$_2$CH$_3$; saturated or unsaturated linear or branched $C_1$–$C_{20}$alkylgroups; or an aliphatic, alicyclic (ir aromatic segment containing aromatic ether, aliphatic ether, ethoxy, propoxy, isopropoxy, oxytetramethylene, aliphatic or aromatic ester, siloxane or carbonate linkages.

8. A method according to claim 7 wherein A is a linear or branched aliphatic or substituted alicyclic diol or unsubstituted alicyclic diol residue bearing saturated or unsaturated $C_1$–$C_{20}$alkylgroups, ether, ethoxy, propoxy, isopropoxy, oxytetramethylene, ester, sulfone, sulfoxide, siloxane and carbonate linkages.

9. A method according to claim 7 wherein A is an aliphatic or substituted alicyclic diol or unsubstituted alicyclic diol, cyclohexane dimethanol, hydrogenated Bisphenol A and hydrogenated Bisphenol F.

10. A method according to claim 7 wherein A is an aromatic diol residue selected from Bisphenol A, Bisphenol F, hydroquinone, biphenol, aromatic diols bearing a flexible segment between the aromatic rings and $R_1$ is —CH$_2$CH(OH)CH$_2$—.

11. A method according to claim 10 wherein A is an aromatic diol residue selected from Bisphenol A, $R_1$ is —CH$_2$CH(OH)CH$_2$— and m is greater than 15.

12. A method according to claim 11 wherein the composition comprises the reactive polyether polyol modifier from about 1 to about 45 percent by weight.

13. A method according to claim 7 wherein the reactive modifier solid or liquid polyether-polyol component is blended, dispersed, diluted or dissolved in at least one liquid or solid diol or polyol containing aromatic rings or polyester linkages or polyether linkages or which is a derivative of aliphatic, alicyclic or aromatic polyhydric alcohols.

14. A method according to claim 7, wherein A is an aliphatic polyol and the polyether polyol component is a solid or liquid aliphatic polyether-polyol.

15. A method according to claim 1 wherein the cationically curable component is a mixture comprising at least one polyglycidyl compound or cycloaliphatic polyepoxide or an epoxy cresol novolac or epoxy phenol novolac-containing polyglycidyl compound having, on average, at least two epoxy groups per molecule and at least one vinyl ether-leased resin.

16. A method according to claim 1 wherein the composition further comprises from 0.5 to 40 percent by weight of a liquid or solid polyhydroxyl compound.

17. A method according to claim 16 wherein said polyhydroxyl compound comprise substances having aromatic carbon rings in their molecules or phenolic compounds having at least two hydroxyl groups or phenolic compounds having at least two hydroxyl groups which are reacted with ethylene oxide, propylene oxide or with ethylene oxide and propylene oxide or hydroxyl compounds having at least one hydroxyl group and at least one epoxide group.

18. A method according to claim 16 wherein said polyhydroxyl compound contains aliphatic, alicyclic or substituted alicyclic groups.

19. A method according to claim 16 wherein said polyhydroxyl compound is a derivative of aliphatic or alycyclic or aromatic polyhydric alcohols bearing polyester, polyether, polysiloxane and/or polyhydrocarbon linkages.

* * * * *